Figures 1, 2, 3:
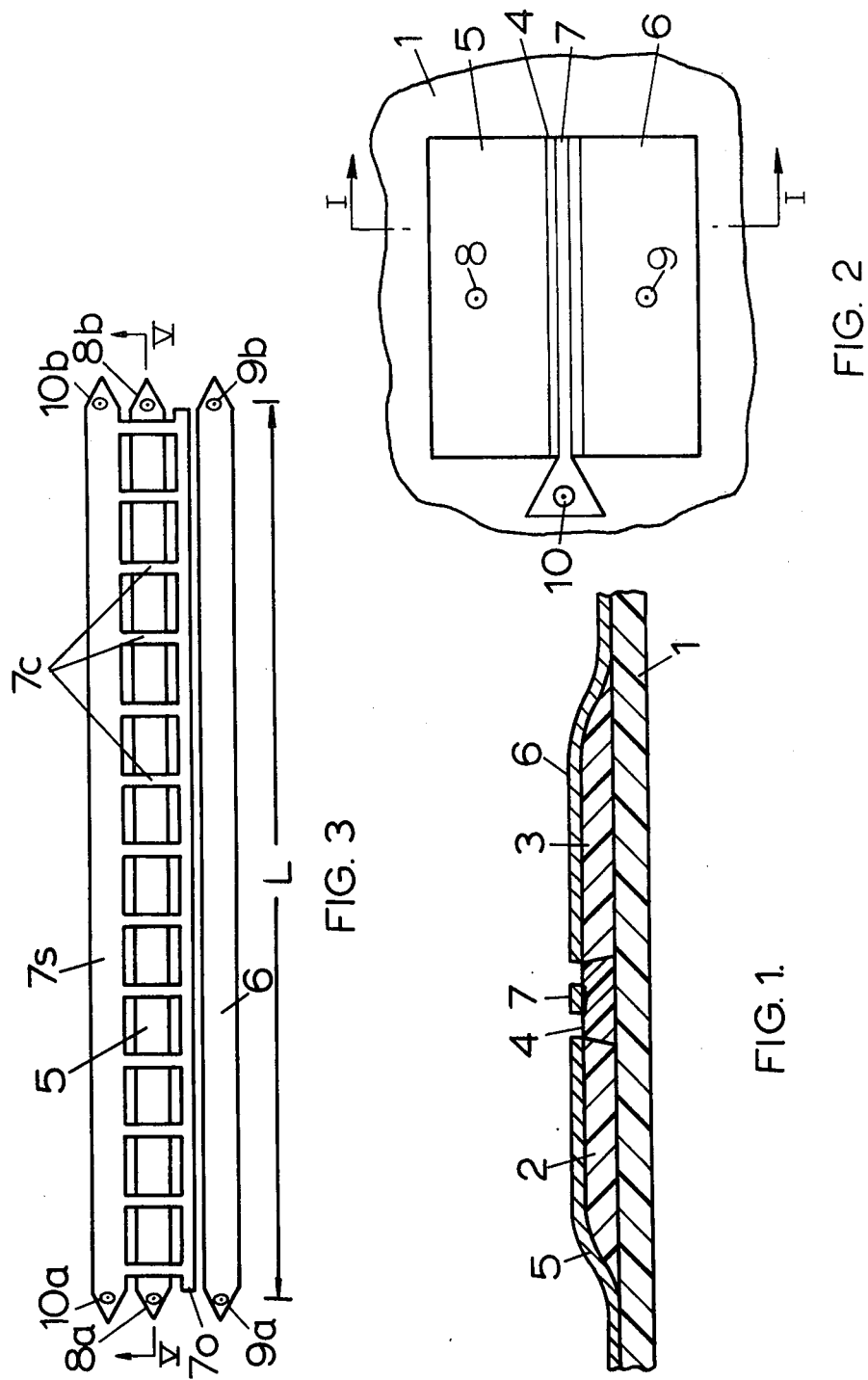

United States Patent [19]

Gray et al.

[11] 4,065,782

[45] Dec. 27, 1977

[54] FIELD-EFFECT TRANSISTORS

[75] Inventors: Kenneth Walter Gray; Huw David Rees, both of Malvern, England

[73] Assignee: The Secretary of State for Defence in Her Britannic Majesty's Government of the United Kingdom of Great Britain and Northern Ireland, London, England

[21] Appl. No.: 732,823

[22] Filed: Oct. 15, 1976

[30] Foreign Application Priority Data

Oct. 17, 1975 United Kingdom ............... 42825/75

[51] Int. Cl.² ..................... H01L 29/80; H01L 29/78; H01L 29/06; H01L 23/48
[52] U.S. Cl. ......................................... 357/23; 357/22; 357/55; 357/68
[58] Field of Search ........................ 357/23, 22, 55, 68

[56] References Cited

U.S. PATENT DOCUMENTS

| 3,813,586 | 5/1974 | Conner | 357/23 |
| 3,969,745 | 7/1976 | Blocker | 357/23 |

Primary Examiner—Edward J. Wojciechowicz
Attorney, Agent, or Firm—Pollock, VandeSande and Priddy

[57] ABSTRACT

A field-effect transistor (FET) for use at microwave frequencies has electrodes which act as transmission lines. Gate electrodes can comprise a narrow operative part between the source and drain electrodes which provides gating action, and a gate supply part which lies outside the source and drain electrodes and is connected to the operative part by a plurality of connections distributed along its length. In one form the device can be used as an amplifier and as such is capable of providing higher power handling capacity than conventional FETs, since the device can be extended in size and phase differences between various parts of the device compensate for one another. Other forms and applications are disclosed as a modulator and as a convoluter.

8 Claims, 8 Drawing Figures

FIELD-EFFECT TRANSISTORS

This invention relates to field-effect transistors (FETs), and more particularly to FETs for use at microwave frequencies; that is to say at frequencies conveniently expressed in Gigahertz.

FETs are known which can be used at microwave frequencies, but problems arise when it is attempted to provide FETs capable of handling greater amounts of microwave power. The electrodes in an FET are generally in the form of parallel metal strips, forming a source electrode, a drain electrode, and one or more gate electrodes between the source and drain. To provide greater power handling capability longer electrodes are used, making the device larger, so that more current can flow through the device for the same current density. At microwave frequencies, however, the dimensions of the device are comparable with the wavelengths involved, so the power handling capacity cannot simply be increased by increasing the size of the device, besides which, since wavelength is frequency dependent, the properties of the device will also be frequency dependent.

According to the present invention there is provided a field-effect transistor capable of operation at microwave freqencies wherein at least some of the electrodes are adapted to act as transmission lines.

When an FET according to the invention is to be used as an amplifier an input signal will be applied between the gate and source electrodes at one end and will propagate to the other end along the transmission line formed by the gate and source electrodes. The output will be taken from between the source and drain electrodes at the said other end. In an FET intended for use as an amplifier, the transmission line formed by the source and drain electrodes should have substantially the same wave velocity as the transmission line formed by the gate and source electrodes. Also, the transmission lines should have substantially nonreflecting terminations.

The gate electrode may be in two parts, a narrow operative gate part, situated between the source and drain electrodes for producing the actual gating effect, and a gate supply part, situated on the opposite side of the source electrode from the operative gate part and electrically connected to the operative gate part by a plurality of connections distributed along its length. In this way the gate electrode, taken as a whole, can be made of comparable size to the source and drain electrodes, which is desirable so that the transmission line formed by the gate and source electrodes may have a comparatively low resistance per unit length, and also have comparable properties to the transmission line formed by the source and drain electrodes, while at the same time the operative gate part is narrow thus allowing the source and drain electrodes to be close together which, as well as giving the known advantage of a shorter transit time for charge carries, is of particular advantage when the source and drain electrodes form a transmission line.

To modify or control their transmission-line characteristics, the electrodes may be provided with side arms periodically distributed along their length, thus increasing their capacitance per unit length. The spacing and length of the side arms may be such as to provide dispersion if that is desired. To increase further the capacitance per unit length of the electrodes the side arms may extend over, but not make ohmic electrical contact with, a portion of highly doped semiconductor. The side arms may, for example, form a Schottky barrier junction with the highly doped semiconductor. Since the width of the barrier layer, and hence the capacitance, then depends on the voltage between the arms and the highly doped semiconductor, the capacitance per unit length, and hence the transmision-line characteristics, of the electrodes, can be controlled by means of a controllable bias voltage. Instead of a Schottky-barrier junction other non-conducting junctions could be used, for example a p-n junction or a metal-insulator-semiconductor junction.

The transmission-line characteristics also depend on the bias voltage between the source and drain electrodes, partly owing to changes in the dimensions of the depletion region in the semiconductor on which the FET is made, which affects the capacitance between the electrodes, and partly owing to a change in transconductance. The transconductance effect is particularly important when there is a substantial amount of coupling between the electrodes, when the transconductance will affect the rate of attenuation of waves propagating along the FET, which becomes in effect one active transmission line. By suitably selecting the transconductance the rate of attenuation can be reduced to zero, or made negative, so as to provide a transmission-line delay device with no loss, or even with amplification.

An FET according to the invention can be used as a non-linear device such as a modulator. Thus two input signals can be superimposed on the gate electrode. There will then, because of the nonlinearity of the characteristic of the FET, be a component in the output signal containing the product of the input signals. Alternatively two separate gate electrodes may be provided, to form a tetrode FET, in which case the input signals may be separately applied to the two gate electrodes. If the transmission line velocities of the gate electrodes are different, or if the input signals are applied so that they propagate in the opposite sense either in a tetrode FET or in a triode FET with one bate electrode, there will be a component in the output signal including a convolution of the two input signals.

An FET according to the invention may be constructed on an insulating substrate with a conducting backing so that the electrodes form microstrip transmission lines.

Figure 4:
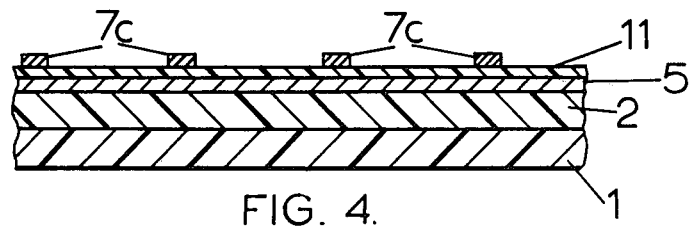
Figure 5:
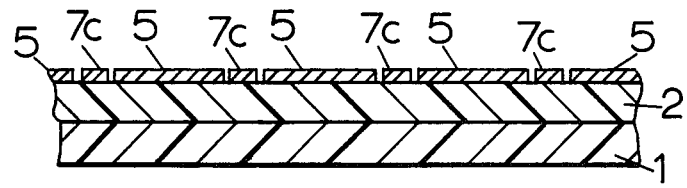
Figure 6:
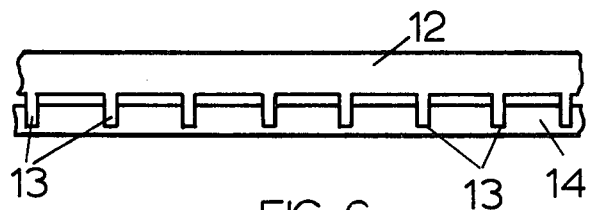
Figure 7:
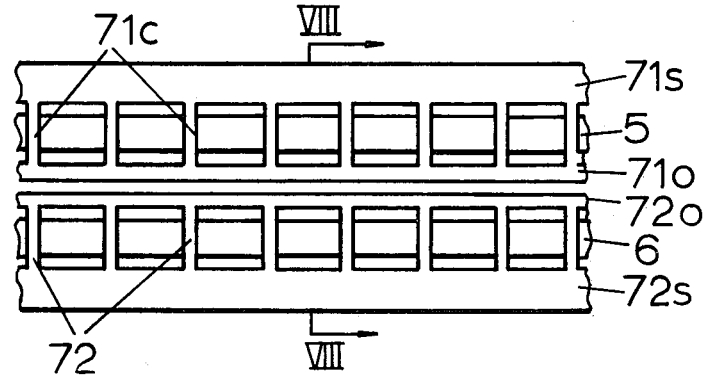
Figure 8:
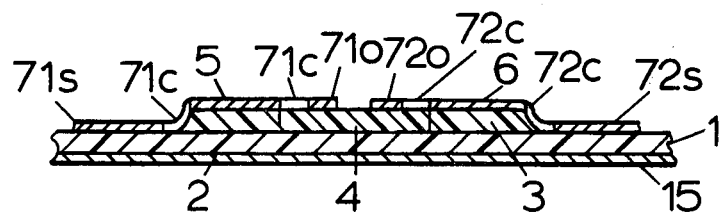

Some embodiments of the invention will now be described by way of example with reference to the accompanying drawings, of which:

FIGS. 1 and 2 show, in section and plan respectively, the structure of a known type of FET, FIG. 3 shows in plan the form of the electrodes in an FET according to the invention, FIGS. 4 and 5 show in section a detail of two alternative forms of the FET of FIG. 3, FIG. 6 shows a plan view illustrating a modification applicable to an FET according to the invention, FIG. 7 shows a plan view of part of the electrodes of a tetode FET according to the invention, and FIG. 8 shows part of the FET of FIG. 7 in section.

In FIGS. 1 and 2 are shown part of a known type of FET. FIG. 1 shows part of the section shown as I—I in FIG. 2. On an insulating substrate 1 is a patch of semiconductor 2, 3 and 4. A source electrode 5 overlies part of the substrate 1 and also overlies, and makes ohmic contact with a part of 2 of the semiconductor. A drain electrode 6 similarly overlies a part of the substrate 1 and overlies and makes ohmic contact with a part 3 of the semiconductor. The source 5 and drain 6 electrodes are positioned close together, but not touching, and they leave a narrow strip 4 of the semiconductor uncovered between them. A gate electrode 7 runs along the middle of the strip 4, overlying it, between, but not making contact with, the source 5 and drain 6 electrodes. The gate electrode 7 does not make ohmic contact with the strip 4, but forms a Schottky-barrier junction with it.

The semiconductor is all of the same conductivity type, preferably n-type for microwave applications because of the greater mobility of electrons compared with holes. The parts 2 and 3 underlying the source and drain electrodes 5 and 6 may be highly doped (n+-type), to form quasi-metallic regions acting as extensions to the source and drain electrodes 5 and 6, bringing them into good electrical contact with the lightly-doped strip 4, which is the active part of the device. The electrodes 5, 6 and 7 are provided with electrical connections 8, 9 and 10 respectively for connection to external circuitry (not shown).

The direction of current flow in an FET is directly from source to drain across the active region. In FIG. 1 it is therefore from left to right, and in FIG. 2 vertically downwards across the strip 4.

Other types of FET than that illustrated in FIGS. 1 and 2 are known and the present invention can be applied to any type capable of operation at microwave frequencies.

Since the strip 4 is the active region of the device it is desirable to make it as long as possible if a high power-handling capacity is required. In microwave applications, however, strip 4 cannot be made very long without the dimensions of the device becoming comparable with the wavelength of electromagnetic waves at the operating frequency, which may give rise to unwanted resonance effects and also, because there will be phase differences in the signals on the electrodes 5, 6 and 7 at different points along the length of the strip 4, some parts of the strip may produce a contribution to the output of the device which cancels out, rather than augments, the contribution from other parts. There is thus a practical limit to the amount by which the operative length of a conventional FET for microwave use may be extended.

FIG. 3 shows a plan view of an FET according to the invention. In this and subsequent plan views the substrate 1 and the visible part of the strip 4 are suppressed for the sake of clarity. The source 5 and drain 6 electrodes are in the form of elongate strips, and the gate electrode has a narrow operative gate part 7o which lies between the source and drain electrodes and a gate supply part 7s which has similar dimensions to the source and drain electrodes 5 and 6 and is connected to the operative gate part 7o by means of several cross-connections 7c. Each of the electrodes 5, 6 and 7 has two connections 8a, 8b, 9b, 10a and 10b, one at each end, for connection to external circuitry, (not shown). In the case of the gate electrode the connections 10a and 10b are on the gate supply part 7s.

The gate supply part 7s and the source 5 together act as a parallel-strip transmission line. In use an input signal may be applied between connections 10a and 8a and a suitable matching load connected between connections 10b and 8b. The input signal travels along the transmission line formed by the source 5 and the gate supply part 7s at a predeterminable velocity V. If the input signal is S(t) the signal at a point a distance X along the device is then $$S(t - \frac{X}{V}).$$

If the amplification per unit length of this device is A, an element of length δX at a distance X along the device sill produce a contribution to the output signal of $$A S\left(t - \frac{X}{V}\right)\delta X$$

which will appear as a current flowing between the source 5 and drain 6 electrodes at a distance X along the device. The source 5 and drain 6 electrodes form a parallel-strip transmission line which, in the basic form of the device, has the same wave velocity V. A suitable matched load is connected between connections 8a and 9a and the output of the device is taken from connections 8b and 9b. Each element of the device thus gives a contribution to the output signal of $$A S\left(t - \frac{X}{V} - \frac{(L-X)}{V}\right)\delta X = A S\left(t - \frac{L}{V}\right)\delta X$$

making a total contribution of $$A L S(t - \frac{L}{V})$$

where L is the length of the device.

The device thus acts as an amplifier and the whole of the length of the active region makes its proper contribution.

Although this length L of the device may be comparable with, or even much larger than, the wavelength of electromagnetic waves at the operating frequency, the effects of phase differences between different points in the device have been rendered innocuous by arranging that the total phase shift undergone by an element of the signal is the same whatever path it follows through the device.

The device shown in FIG. 3 can also be used as a filter, since if the ends of the transmission lines are deliberately terminated by unmatched loads, standing waves can be set up in the device and the amplification becomes frequency dependent. The resonant frequencies of the device can be varied by varying the terminating loads, and the length L of the device may be chosen to be suitable for a given frequency.

If the device is to be used only as an amplifier the matched terminating loads may be incorporated into the device itself and the connections 10b and 9a may be omitted.

In FIG. 4 is shown part of the sections shownas V — V in FIG. 3 in one form of the device, showing how the cross-connections 7c are insulated from the source electrode 5. The source electrode 5 has an insulating layer 11 formed on it and the cross-connections 7c are formed on the insulating layer 11. An alternative arrangement is shown in FIG. 5 in which the cross-connections 7c are formed in gaps in the source electrode 5. In this arrangement both the source electrode 5 and the cross-connections 7c are formed directly on the part 2 of semiconductor under the source 5, but whereas the source electrode 5 is made to make good electrical contact with the part 2 of the semiconductor, the cross-connections 7c are made to form a non-conducting Schottky barrier junction. With this arrangement the part 2 of the semiconductor needs to be highly doped (eg $n+$- type) so as to form a continuation of the source electrode 5 in the gaps.

FIG. 6 illustrates a modification to the basic form of the device. An electrode 12 is provided with side-arms 13 spaced periodically along its length. If the side-arms 13 are widely spaced so that the spacing between adjacent ones is of the order of half a wavelength or more their effect will be to introduce frequency-dependent behaviour into the device. If they are closely spaced however their effect is simply to increase the capacitance per unit length of the electrode 12 and hence to modify the properties of the transmission line of which the electrode 12 forms a part. The amount of capacitance introduced by the side-arms may be increased by providing an area of highly doped semiconducting material 14 which the side arms 13 partially overlay, but with which they do not make ohmic contact. For example the side arms 13 may form Schottky barrier junctions with the semiconductor 14. By varying the bias voltage between the electrode 12 and the semiconductor 14 the width of the depletion layers in the Schottky barriers, and hence their capacitance, may be varied. The modification may be applied to any conveniently placed electrode 12.

In FIGS. 7 and 8 are shown, in part plan and section respectively, a tetrode FET according to the invention. There are now two gate electrodes, with respective narrow operative gate parts 71o and 72o lying close and parallel to each other between the source 5 and drain 6 electrodes. The gate electrodes also have respective gate supply parts 71s and 72s lying adjacent to the source 5 and drain 6 electrodes respectively and connected to the respective operative gate parts 71o and 72o by cross-sections 71c and 72c. It can be seen in FIG. 8 that there is a conducting backing 15 to the insulating substrate 1, so that the electrodes 5, 6, 71s and 72s form microstrip transmission lines together with the conducting backing 15 instead of parallel-strip transmission lines with one another. This simplifies the layout of the more complex forms of the invention since it is no longer necessary to place electrodes close together to form parallel-strip transmission lines.

The tetrode FET according to the invention can be used as a non-linear device, for example to form convolutions of signals. For example, suppose that a signal $S_1(t)$ is applied on one gate electrode 71s at the left-hand end, say, and a signal $S_2(t)$ is applied on the other gate electrode 72s at the right-hand end, and that output is taken from the drain electrode 6 at the right-hand end. Suppose further that the wave velocities in the gates 71 and 72 and the drain 6 are $V_1$, $V_2$ and $V_d$ respectively. Then the signal at a point X on the gate 71 is $$S_1\left(t - \frac{X}{V_1}\right)$$

and the signal at a point X on the gate 72 is $$S_2\left(t - \frac{(L-X)}{V_2}\right)$$

There will be a component of the output signal from the product of the input signals, due to the inherent non-linearity of the device. The contribution to this component from an element of length $\delta X$ at X is $$A\delta X S_1\left(t - \frac{X}{V_1}\right) \cdot S_2\left(t - \frac{(L-X)}{V_2}\right)$$

which appears at the output as $$A\delta X S_1\left(t - \frac{X}{V_1} - \frac{(L-X)}{V_d}\right) \cdot$$

$$S_2\left(t - \frac{(L-X)}{V_2} - \frac{(L-X)}{V_d}\right)$$

$$= A\delta X S_1\left[t - X\left(\frac{1}{V_1} - \frac{1}{V_d}\right) - \frac{L}{V_d}\right] \cdot$$

$$S_2\left[t + X\left(\frac{1}{V_2} + \frac{1}{V_d}\right) - L\left(\frac{1}{V_2} + \frac{1}{V_d}\right)\right]$$

so the total of the contributions to the component at the output is $$A \int_o^L S_1\left(t - d_1 - k_1 X\right) \cdot S_2\left(t - d_2 + k_2 X\right) dX$$

where $d_1$ and $d_2$ represent fixed delays $$\frac{L}{V_d} \text{ and } L\left(\frac{1}{V_2} + \frac{1}{V_d}\right)$$

respectively and $k_1$ and $k_2$ are given by $$k_1 = \frac{1}{V_1} - \frac{1}{V_d}$$

$$k_2 = \frac{1}{V_2} + \frac{1}{V_d}$$

The fixed delays $d_1$ and $d_2$ can be compensated by introducing a separate and complementary delay into one of the input signals. The factors $k_1$ and $k_2$ depend on the wave velocities $V_1$, $V_2$ and $V_d$ whose values can be assigned to some extent by suitable design of the electrodes and by use of the modification illustrated in FIG. 6.

The embodiments and applications described above are not intended to constitute an exhaustive catalogue and many modifications and variants will now be apparent to a person skilled in the FET and microwave arts. For example it would be possible to include discrete components such as varactor diodes connected periodically along any of the electrodes to modify their propagation properties. Also two or more signals can be applied to one gate electrode, either at the same or opposite ends, so the basic triode version of the device can be used as a mixer or correlator as well as a tetrode version.

As persons skilled in the FET art will appreciate the drawings are not accurately to scale and in particular width of the operative parts of the gate electrodes and of the active region are exaggerated for the sake of clarity.

We claim:

1. A field-effect transistor operable at microwave frequencies, said field-effect transistor having a source electrode, a drain electrode, at least one gate electrode, and an active region between said source electrode and said drain electrode, at least some of said electrodes being elongated transmission lines which have substantial length compared with the wavelengths of microwave signals in said transmission lines, and said transmission-line electrodes extending transversely to the direction of carrier flow from said source electrode to said drain electrode across said active region, whereby in use the phases of signals in said transmission-line electrodes vary continuously with distance along said active region in the direction transverse to the said direction of carrier flow.

2. The field-effect transistor of claim 9 wherein said transmission-line electrodes include a gate electrode comprising an elongated narrow operative gate part situated between said source and drain electrodes, and an elongated gate supply part situated outside said source and drain electrodes and electrically connected to said elongated operative gate part by a plurality of connections distributed along its length.

3. The field-effect transistor of claim 2 wherein said gate supply part is situated adjacent to said source electrode and forms together therewith a parallel-strip transmission line, and wherein said source and drain electrodes together form another parallel-strip transmission line.

4. The field-effect transistor of claim 1 formed on an insulating substrate with a conducting backing, so that said transmission lines are microstrip transmission lines.

5. The field-effect transistor of claim 2 formed on an insulating substrate with a conducting backing, so that said transmission lines are microstrip transmission lines.

6. The field-effect transistor of claim 1 wherein he transmission-line velocities of said transmission lines are equal.

7. The field-effect transistor of claim 9 wherein at lest one of said transmission-line electrodes has side arms extending in directions transverse to the direction of elongation of said transmission-line electrode and periodically distributed along the length of said electrode.

8. The field-effect transistor of claim 7 wherein the side arms extend over but do not make ohmic electrical contact with a portion of highly doped semiconductor material in said transistor.

* * * * *